United States Patent [19]

Krause

[11] Patent Number: 5,572,095
[45] Date of Patent: Nov. 5, 1996

[54] METHOD AND APPARATUS FOR DRIVING DEFLECTION AND HIGH VOLTAGE STAGES IN A VIDEO DISPLAY

[75] Inventor: Peter Krause, Singapore, Singapore

[73] Assignee: Apple Computer, Inc., Cupertino, Calif.

[21] Appl. No.: 505,730

[22] Filed: Jul. 21, 1995

[51] Int. Cl.$^6$ ............................... H01J 29/70; H01J 29/76
[52] U.S. Cl. ........................................................ 315/408
[58] Field of Search ................................... 315/408, 395, 315/396, 397

[56] References Cited

U.S. PATENT DOCUMENTS

| | | | |
|---|---|---|---|
| 4,649,325 | 3/1987 | Guerin et al. | 315/383 |
| 4,675,740 | 6/1987 | Bafaro et al. | 358/243 |
| 4,897,580 | 1/1990 | Schultz | 315/408 |
| 5,107,190 | 4/1992 | Schultz et al. | 315/387 |

*Primary Examiner*—Theodore M. Blum
*Attorney, Agent, or Firm*—Burns, Doane, Swecker & Mathis, L.L.P.

[57] ABSTRACT

The present invention, generally speaking, provides an improved base drive arrangement for scan and/or EHT output stages in a television or video display monitor. In accordance with one aspect of the invention, by adding just a few components to an existing main base drive circuit, two power transistors may be driven, e.g. a scan output transistor and an EHT output transistor. The two power transistors are switched at the same time, allowing pulse width modulators of the scan and EHT circuits to operate on a common time base. Switching of two power transistors at the same time would usually require a quite complicated design to offset the different storage times of the two devices, thereby achieving high performance but at a considerable cost premium. The base drive circuit of the invention achieve substantial synchronization of the two transistors at minimal cost. In accordance with another aspect of the invention, a base drive circuit uses a low DC supply voltage and a resistive element in series with the main current path in order to produce a more constant maximum base current over frequency.

5 Claims, 4 Drawing Sheets

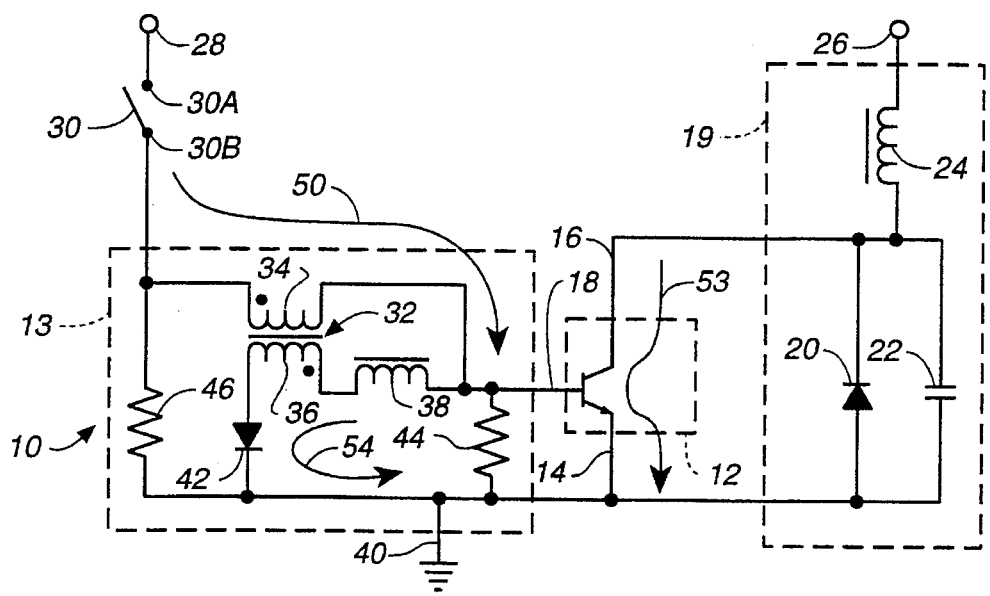
FIG._1
(PRIOR ART)
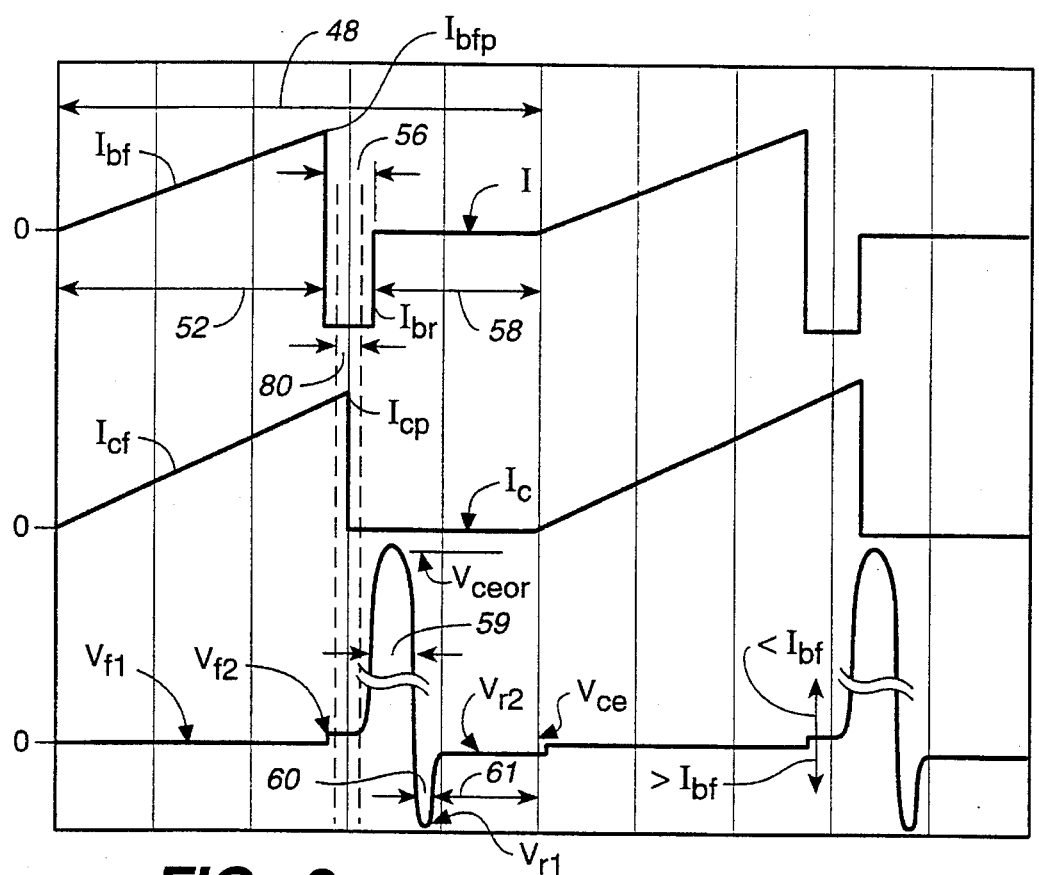
FIG._2
(PRIOR ART)

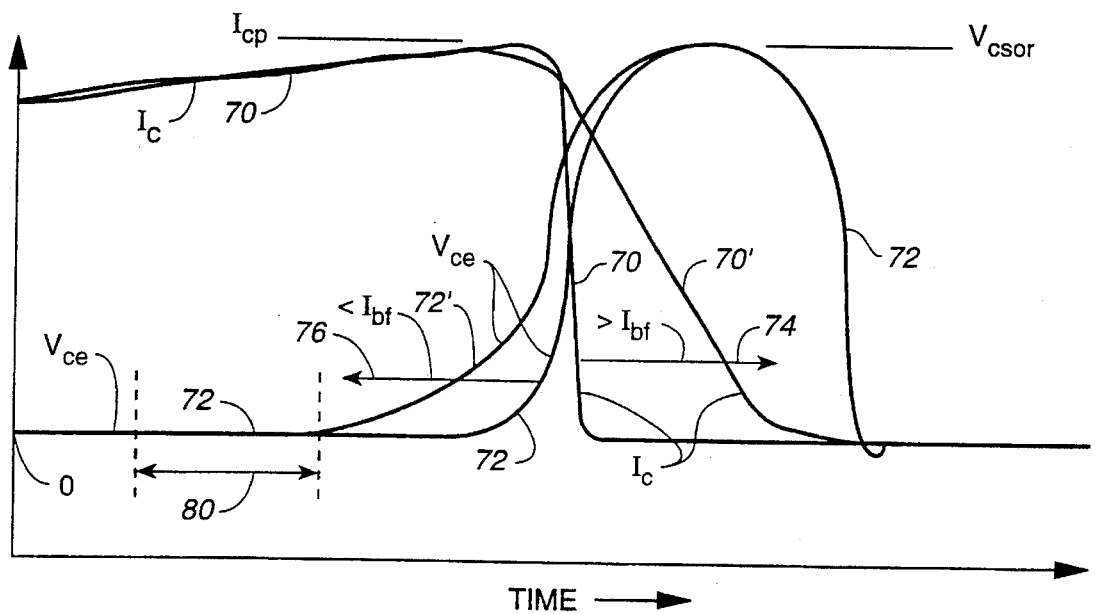
FIG._3
(PRIOR ART)
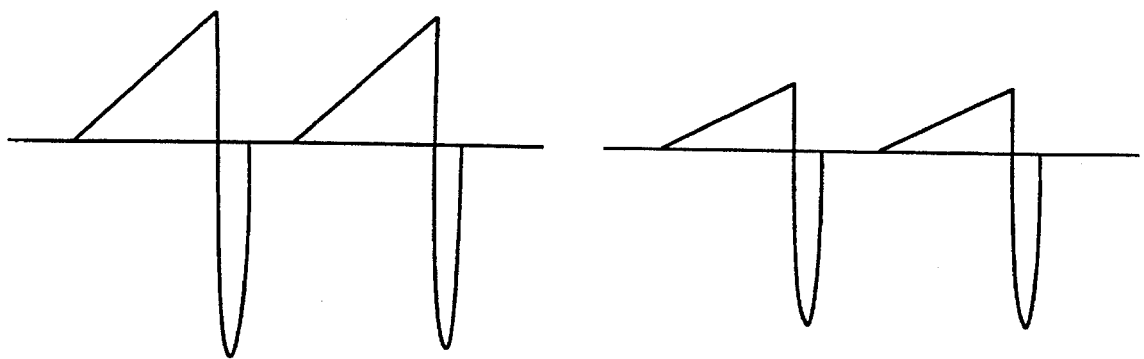
FIG._4     FIG._5

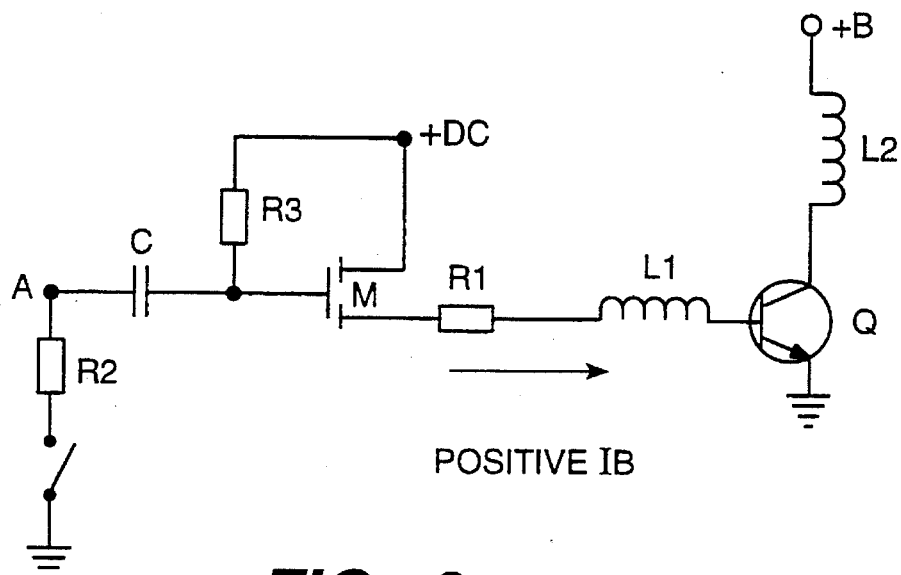
FIG._6
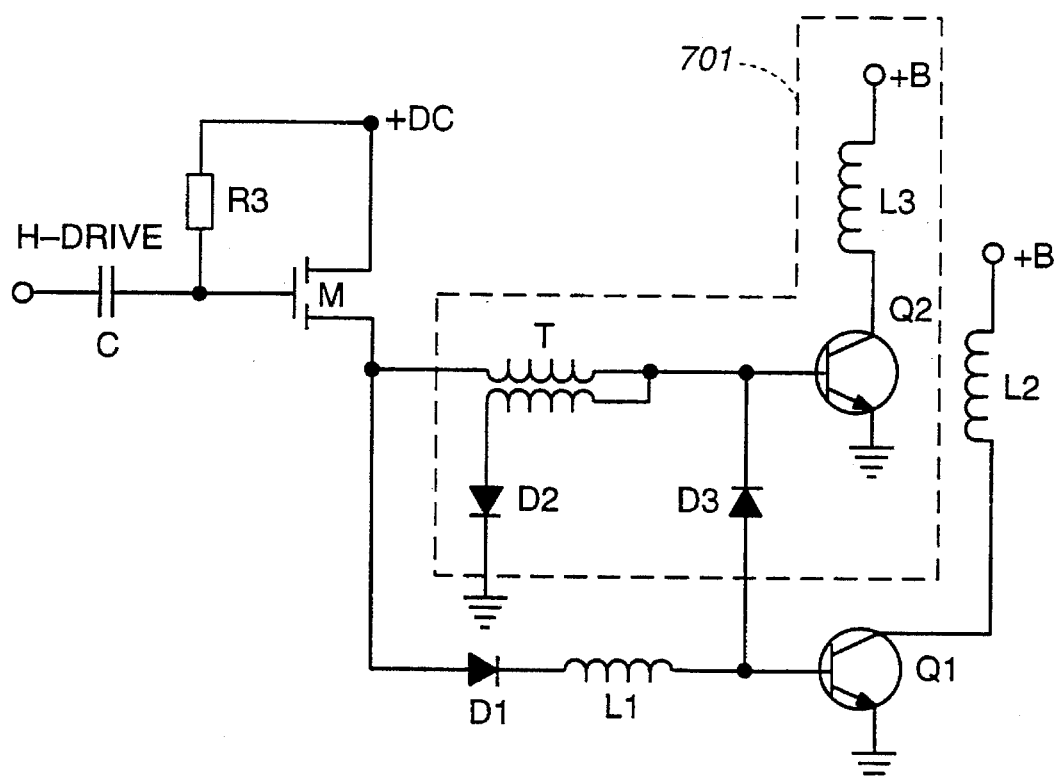
FIG._7

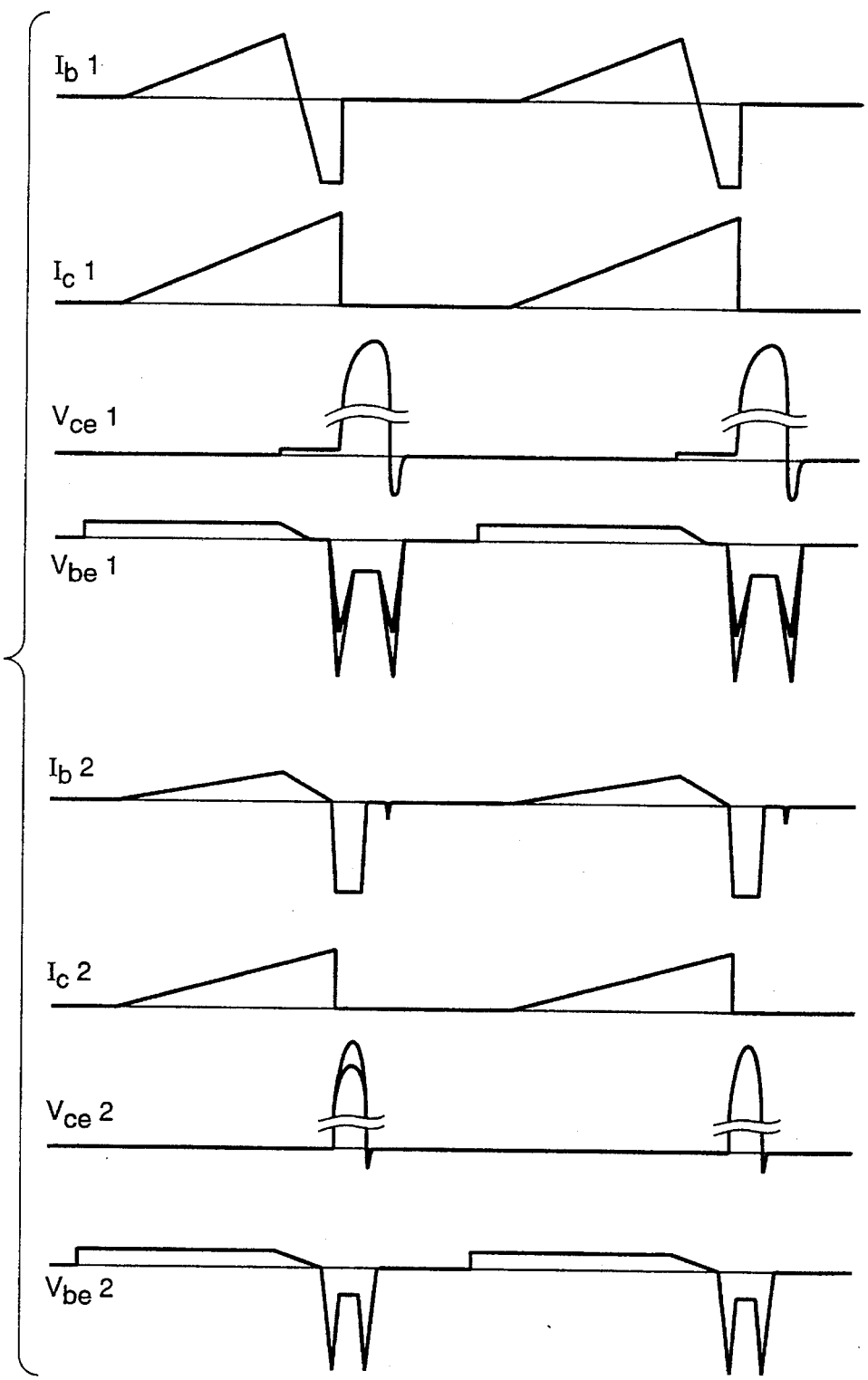
FIG._8

METHOD AND APPARATUS FOR DRIVING DEFLECTION AND HIGH VOLTAGE STAGES IN A VIDEO DISPLAY

BACKGROUND OF THE INVENTION

1. Field of the Invention

The present invention relates to drive circuitry in television and video display monitors, more particularly to drive circuitry for EHT (electrical high tension) and scan output stages in multiscan displays.

2. State of the Art

In television and video display monitors using a CRT (cathode ray tube), a horizontal deflection current is produced in a horizontal deflection coil to create a magnetic field used to deflect an electron beam (produced by a cathode of the CRT) back and forth across a display screen. As the electron beam is scanned back and forth across the display screen, it is modulated to produce on the display screen spots of varying luminous intensity, thus forming an image to be viewed. A high voltage, referred to as EHT (electrical high tension), is applied to an anode of the CRT and accelerates the electron beam, causing it to strike the screen at a very high speed.

Typically, a periodic horizontal drive signal is applied to a horizontal scan output stage (i.e., a power transistor) to produce a train of high-voltage retrace pulses used to generate the horizontal retrace current. The same train of retrace voltage pulses may also be used to generate the EHT using a voltage step-up transformer, commonly referred to as the flyback transformer. Where high performance is not required, as in television sets and some less-expensive video monitors, a single output stage is used to generate the horizontal retrace current and to generate the EHT, with the flyback transformer and the retrace coil being combined on a common core as part of a single assembly. In high performance video monitors, separate scan and EHT output stages are provided, with the retrace coil and the flyback transformer also being separated. Power is provided to the scan and EHT output stages from a so-called B+ power supply.

In a multiscan monitor, the horizontal drive frequency can vary between, say, 30 kHz and 80 kHz. At lower horizontal frequencies, current builds up in the primary of the flyback transformer for a longer period of time while the EHT output stage is turned on. When the EHT output stage is turned off, therefore, a larger voltage pulse is generated than in the case of a higher horizontal frequency. If the power supply to the EHT output stage were to remain the same throughout the range of possible horizontal frequencies, the EHT would then be frequency dependent, resulting in performance variations.

Furthermore, even in the case of a single horizontal frequency, variations in picture content and consequent variations in beam current may also produce variations in the EHT. For example, the top half of a picture frame might be black (no beam current) and the bottom half of the picture frame might be white (high beam current). During high beam current, the EHT is loaded down and reduced, for example by 1–2 kV. As a result, the picture becomes wider in the white are than in the black area, creating picture distortion. Therefore, it is common for the B+ power supply to the EHT output stage to be varied using a step-down power supply and a control loop in order to maintain a fairly constant EHT.

In addition, in order to maintain the correct horizontal deflection current across a range of frequencies, it is common to provide a separate B+ supply for the scan output stage and to vary the same using a step-down power supply and a control loop.

Further details concerning the regulation of independent B+ power supplies for scan and EHT output stages using pulse width modulation may be found in U.S. application Ser. No. 08/505,424 (Attorney Docket Number P1597/253) filed on even date herewith and incorporated herein by reference.

The board range of frequencies possible in a multiscan display also affects the drive circuit of the scan output stage. Referring to FIG. 1, in a known drive circuit for a scan output stage, a bipolar transistor or other amplifying 12 is coupled to a load 19, comprising in this example, a diode 20, a storage capacitor 22 and a horizontal deflection yoke coil 24 connected to a DC power supply via a terminal 26. The coil 24, diode 20 and capacitor 22 form a resonant load.

An input 18 of the transistor 12 is driven from a DC power supply terminal 28 through a rapidly acting switch 30 and a driver circuit 13. The switch 30 opens and closes at the desired horizontal scan frequency. The driver circuit 13 includes a transformer 32 having a primary winding 34 and a secondary winding 36. A coil 38 is connected between one end of the transformer secondary 36 and the transistor input 18. The other end of the transformer secondary is coupled to a common terminal 40 through a diode 42. A resistor 44 may be provided between the transistor input 18 and the common terminal 40, which is also tied to the emitter 14 of the transistor 12. Furthermore, a resistor 46 may be provided between the switch 30 and the reference terminal 40.

Waveform traces of the transistor input current ($I_b$), transistor output current ($I_c$) and transistor output voltage ($V_{ce}$) are illustrated in FIG. 2. In FIG. 2, the waveforms are not drawn to scale. Referring to FIG. 1 and FIG. 2, in operation, when the switch 30 closes, a current 50 (FIG. 1) flows through the transformer primary 34 to the transistor input 18. The switch 30 remains closed for an interval 52 in FIG. 2 during which the input current $I_b$ increases approximately linearly as shown in the upper trace of FIG. 2 (left side). There is a corresponding increase in the output current 53 (FIG. 1), shown as $I_c$ in the middle trace of FIG. 2. The input current $I_b$ and the output current $I_c$ are related. For convenience of future reference, the input current $I_b$ flowing during the interval 52 is referred to as the forward input current $I_{bf}$ and identified as current 50 in FIG. 1 and $I_{bf}$ in FIG. 2. The portion of the output current $I_c$ (current 53 in FIG. 1 ) which corresponds to $I_{bf}$ is identified in FIG. 2 as $I_{cf}$. During this interval, the transistor output voltage, measured between terminals 14 and 16 and denoted $V_{ce}$ for convenience as and shown as the lower trace in FIG. 2, has a small value denoted as $V_{fl}$ corresponding to the saturated forward voltage drop of the transistor.

At the end of interval 52, $I_b$ will have risen to its peak forward value (e.g., $I_{bfp} \cong 1.5A$). The switch 30 then opens and the collapsing magnetization in the windings of the transformer 32 cause an immediate reversal of the input current $I_b$ so that a current 54 in FIG. 1 now flows out of the transistor input 18 through the inductor 38, the transformer secondary 36 and the diode 42 and back to the reference terminals 14, 40. The current 54, referred to as the reverse input current, continues to flow during the interval 56 (FIG. 2), and is denoted in FIG. 2 as $I_{br}$. The interval 56 is typically shorter than the interval 52 and the reverse current 54 is larger than the peak forward current (e.g., $I_{br} \cong 4-5A$). Since the transistor 12 has not yet turned off, the output current $I_c$ continues to flow in the same direction as previously and may, as shown in FIG. 2, even continue to increase for a time after has been reversed. The abrupt reversal of input current $I_b$ is a feature of the drive circuit 13.

The interval 56 is referred to in the art as the device storage time and corresponds approximately to the time that is required to extract from the transistor 12 the excess charge stored therein during the interval 52 by the input current $I_{bf}$. In the case of a bipolar transistor, this excess charge is the base charge which places the transistor in saturated forward conduction. During the first part of the interval 56, the output voltage has a small but slightly increased value denoted as $V_{f1}$ (typically about 2V). The transistor output current 53 ($I_c$) continues to increase until substantially all of the stored charge has been removed from the transistor 12, at which point the transistor output current 53 drops from its peak value $I_{cp}$ (typically about 7A) toward zero and $V_{ce}$ rapidly rises. Because of the resonant nature of the load formed by the coil 24, diode 20 and capacitor 22, the waveform during the first part 59 of the final interval 58 is substantially a half sine wave having a peak value denoted as $V_{ceor}$ (typically about 1000V). This is the maximum reverse voltage that the transistor must block. During this transition interval from conduction to blocking when both $I_c$ and $V_{ce}$ have values different than zero a substantial amount of transient energy is being dissipated within the transistor 12.

Once the peak blocking voltage $V_{ceor}$ has passed, $V_{ce}$ swings negative. This negative going $V_{ce}$ excursion (e.g., $V_{r1}$≅−8V to −20V). during the second part 60 of the interval 58 occurs because of the finite amount of time required for the diode 20 to turn on. Once the diode 20 turns on, $V_{ce}$ is damped during the third part 61 of the interval 58 at the diode forward drop (e.g., $V_{r2}$≅0.7V). At the end of the interval 58, the switch 30 closes again and the cycle is repeated.

In FIG. 2, the lower part of the $V_{ce}$ waveform has been expanded so that small voltage changes occurring during certain part of the cycle may be clearly seen despite the presence of peak $V_{ce}$ values (e.g., $V_{ceor}$) that are $10^3$–$10^4$ times larger.

The transient power dissipation during transistor turn-off is very sensitive to the amount of stored charge and hence to the amount of input drive which produced the stored charge during the forward conduction portion of the cycle. This relationship is illustrated in FIG. 3, which shows in greater detail how the output current and output voltage of the transistor 12 vary during the time period when the amplifier is turning off and blocking the resonant voltage swing, i.e., during intervals 56, 59, and 60 of FIG. 2. Compared to FIG. 2, the voltage scale for in FIG. 3 is not enlarged. Thus, the small $V_{ce}$ values (e.g., $V_{f1}$ and $V_{f1}$) which occur during intervals 52 and 56 cannot be distinguished in FIG. 3.

An important factor in minimizing the transient power dissipation is adjusting amplifier input current $I_{bf}$ (i.e., current 50 in FIG. 1 and the upper trace in FIG. 2) during the interval 52 so as to provide adequate drive current to turn the transistor 12 on during the interval 52 while minimizing the stored charge that must be later removed during the interval 56 by the current 54. In FIG. 4, the $I_c$ trace 70 and the $V_{ce}$ trace 72 correspond to the $I_c$ and $V_{ce}$ traces shown in FIG. 2 when the circuit 10 is adjusted to provide minimum transient power dissipation. FIG. 3 shows how the $I_c$ and $V_{ce}$ traces are affected by increasing and decreasing the amount of $I_{bf}$ during the interval 52. Increasing $I_{bf}$ has the effect of extending the falling portion of the $I_c$ trace 70 to the right in the direction of arrow 74 to location 70', i.e., toward a later time. Decreasing $L_{bf}$ has the effect of extending the rising portion of the $V_{ce}$ trace 72 to the left in the direction of arrow 76 to location 72', i.e., toward an earlier time. Having $I_c$ fall more gradually or $V_{ce}$ rise more gradually increase the $I_cV_{ce}$ transient product and increases the switching power dissipation.

The foregoing drive circuit is described in greater detail in U.S. Pat. No. 5,107,190, incorporated herein by reference.

The circuit of FIG. 1 produces a ramp of base drive current, eliminating the heavy overdrive at the beginning of the collector current ramp and avoiding under drive just prior before turning the device off. A significant problem with this arrangement, however, is that the base current $I_{bf}$ changes with changes in frequency. As a result, the ratio $I_c/I_{bf}$ is also frequency dependent. FIG. 4 and FIG. 5 illustrate in approximate terms the base drive current of the circuit of FIG. 1 at scan frequencies of 30 kHz and 80 kHz, respectively. In order to control the switch transistor 12 efficiently, a constant ratio $I_c/I_{bf}$ is required.

One possible solution would be to vary the DC supply for the base drive. This approach suffers from numerous disadvantages including increased component count, increased cost, the need to control the DC supply, and power-losses. Hence, generating a frequency independent base current using the foregoing design would necessitate higher cost and higher power losses.

As may be appreciated from the foregoing discussion, designing a suitable drive circuit for the scan output stage involves a number of subtle complexities. When separate scan and EHT output stages are provided, devising an economical way to efficiently drive both output stages become problematic.

SUMMARY OF THE INVENTION

The present invention, generally speaking, provides an improved base drive arrangement for scan and/or EHT output stages in a television or video display monitor. In accordance with one aspect of the invention, by adding just a few components to an existing main base drive circuit, two power transistors may be driven, e.g. a scan output transistor and an EHT output transistor. The two power transistors are switched at the same time, allowing pulse width modulators of the scan and EHT circuits to operate on a common time base. Switching of two power transistors at the same time would usually require a quite complicated design to offset the different storage times of the two devices, thereby achieving high performance but at a considerable cost premium. The base drive circuit of the invention achieve substantial synchronization of the two transistors at minimal cost. In accordance with another aspect of the invention, a base drive circuit uses a low DC supply voltage and a resistive element in series with the main current path in order to produce a more constant maximum base current over frequency.

BRIEF DESCRIPTION OF THE DRAWING

The present invention may be further understood from the following description in conjunction with the appended drawing. In the drawing:

FIG. 1 is a schematic diagram of a known base drive circuit;

FIG. 2 is a simplified waveform diagram of the input current, output current and output voltage associated with the transistor of the circuit of FIG. 1;

FIG. 3 is a simplified waveform diagram of the output current and output voltage of the transistor of FIG. 1 showing further details;

FIG. 4 is a simplified waveform diagram shown the base drive current produced by the circuit of FIG. 1 at a low scan frequency;

FIG. 5 is a simplified waveform diagram shown the base drive current produced by the circuit of FIG. 1 at a high scan frequency;

FIG. 6 is a schematic diagram of a portion of a base drive circuit in accordance with one embodiment of the present invention;

FIG. 7 is a schematic diagram of a portion of a base drive circuit in accordance with another embodiment of the present invention; and FIG. 8 is a waveform diagram illustrating operation of the circuit of FIG. 7.

DETAILED DESCRIPTION OF THE PREFERRED EMBODIMENTS

Referring now to FIG. 6, a schematic diagram of a portion of a base drive circuit in accordance with one embodiment of the present invention is shown. Only portions of the base drive circuit essential to an understanding of the invention are shown. Not shown is an inductive load to be driven by the base drive circuit. Also, since the embodiment of FIG. 6 concerns only the positive phase of the base drive cycle, other components more particularly concerned with the negative base drive phase are also not shown.

In FIG. 6, switch S is connected through a pull-down resistor R2 to an input node A. The input node A is capacitively coupled through a capacitor C to the gate of a MOSFET M. The gate of the MOSFET and the drain of the MOSFET are coupled by a resistor R3.

The source of the MOSFET M is connected to a resistive element R1 which is in turn coupled through an inductor L1 to the base of a transistor Q. The inductor L1 may be a solitary coil or may be the primary coil of a transformer such as the transformer 34 of FIG. 1, for example.

The transistor Q is connected in common-emitter configuration. The collector of the transistor Q is connected through an inductor L2 to a voltage source B+. The inductor L2 is the storage inductor in a step-down converter, or Buck converter, and is of no significance to the present invention.

In operation, when the switch S is closed, a positive pulse is produced at the gate of the MOSFET M, causing the MOSFET M to conduct. The DC voltage source then causes a control current $I_b$ to flow through the resistive element R1 and the inductor L1 into the base of the transistor Q, causing the transistor Q to conduct a main current $I_c$ through the inductor L2 to ground. The control current $I_b$ into the base of the transistor Q increases in accordance with the values of R1 and L1. The main current $I_c$ through the transistor Q increases as the control current $I_b$ in accordance with the current gain of the transistor $Q, \beta = I_c/I_b$, until the transistor Q reaches saturation.

The DC supply voltage is deliberately chosen to be low. The resistive element R1 therefore exerts a moderating influence on the increase in base current with decreasing frequency and establishes a fixed maximum base current.

More particularly, assuming a fixed gain of the transistor Q and a fixed peak collector current Icp, the optimal base current over the entire operating frequency range is given by $I_{bp} = I_{cp}/\text{gain}$. For example, using a gain of 4 and a peak collector current of 7.2A, the optimal base current should be 1.8A over the entire frequency range. The resistive element helps such a result to be more nearly achieved, thereby reducing power losses stemming from the generation of excess base current and especially the consequent deleterious affect on switching performance. Such losses in conventional designs may be as high as 12W.

The effect of R1 may be appreciated from the following concrete examples. First assuming that R1 is not present (R1=0), the peak base current will be given by $I_{bp}=(\text{Vin} \times \text{ton})$ L1, where ton is the on time of the horizontal drive signal, i.e., the time during which the horizontal drive signal is low. Illustrative values for maximum and minimum frequency operating conditions are presented in Table I.

TABLE I

| Freq. | Vin | ton | L1 | $I_{bp}$ |
|---|---|---|---|---|
| 80 kHz | 4 V | 6 µs | 15 µH | 1.8 A |
| 30 kHz | 4 V | 17 µs | 15 µH | 4.54 A |

The ratio of the maximum peak base current over frequency to the minimum peak base current is therefore 4.54/1.8=2.53.

Assume now that instead of R1=0, R1=1.8Ω. The current in L1 will then be given by iL=I[1-exp(-t/T)] where I, the maximum current, is equal to Vin/R, t is ton, and T=L/R. Values for maximum and minimum frequency operating conditions are presented in Table II.

TABLE II

| Freq. | Vin | ton | L1 | R | $I_{bp}$ |
|---|---|---|---|---|---|
| 80 kHz | 4 V | 6 µs | 15 µH | 1.8Ω | 1.7 A |
| 30 kHz | 4 V | 17 µs | 15 µH | 1.8Ω | 2.8 A |

The corresponding ratio of maximum to minimum peak base current, instead of 2.53, is now 2.8/1.7=1.6, which translates into a dramatic improvement in efficiency.

Referring to FIG. 7, in accordance with another embodiment of the invention, the base drive circuit of FIG. 1 is modified to provide base drive for two power transistors, e.g., a scan output stage and an EHT output stage. Ignoring for a moment the portion of the circuit designated by the reference number 701, the remainder of the circuit is the same as that of FIG. 6 with the exception of an optional diode D1 connected between the source of the MOSFET M and the inductor L1 for decoupling purposes.

Recall that the circuit of FIG. 6 provided only positive base drive. Without some means of providing a complementary negative base drive phase, the transistor Q1 would linger between the on and off phases and be destroyed by excessive power dissipation represented by the product $I_{cp}V_{ceor}$. Circuitry as in FIG. 1 could be separately provided to produce a negative base drive phase. However, in a system having two separate output stages, such as scan and EHT, switching of the stages would not be synchronized due to the different storage times of the stages. If synchronized switching of the stages can be achieved, then further efficiency and economies may be achieved elsewhere in the system.

In accordance with the embodiment of FIG. 7, circuitry as in FIG. 1 used to produce a negative base drive phase for a separate stage is in effect shared by the transistor Q1 in such as way as to minimize component count and to force the two stages to switch at substantially the same time. Circuitry for the second stage includes a transformer T connected to the base of the output stage Q2 and a diode D2 connected between one end of the transformer secondary to ground. The transistor Q2 is connected in common-emitter configuration. The collector of the transistor Q2 is connected through an inductor L3 to a separate B+ power supply. In addition, a diode D3 is connected so as to conduct current from the base of the transistor Q1 to the base of the transistor Q2.

Operation of the circuit of FIG. 7 is illustrated by the waveform diagram of FIG. 8. Referring to FIG. 8, a negative Vbe of the transistor Q1 is used to generate a negative Ib and Vbe for the second transistor Q2. Note in FIG. 8 that the negative Vbe1 is generated only after the base current of the transistor Q1 has changed its direction. As a result, the negative Ib and Vbe for the transistor Q2 will be in sync with the collector voltage rise of the transistor Q1, and the collector voltage rise of the transistors Q1 and Q2 will be nearly in sync.

The negative base current Ib2 is triggered in two stages. The first stage is triggered by the negative going base current Ib1. The first part of the negative base current Ib2 will reduce the collector current Ic2, marking the beginning of the storage time period of the transistor Q2. The second stage is triggered by the avalanche of the base/emitter junction of the transistor Q1. The second part of the negative base current Ib2 will finally force the collector current Ic2 to zero and will thereafter produce a negative emitter current. As a result of the high negative Vbe2, the base/emitter junction of the transistor Q2 will also be avalanched.

The circuit of FIG. 7 provides numerous advantages as compared to the base drive circuit of FIG. 1. In the case of the transistor Q1, the circuit of FIG. 7 produces maximum positive and negative base drive currents that are almost frequency independent, exhibits extremely low drive losses, and enables high collector currents and voltages to be driven at high frequency. In the case of the transistor Q2, the circuit of FIG. 7 provides a very simple, cost effective base drive realization, requiring only four components in addition to those required for the transistor Q1. The base drive is highly efficient, allowing a normal high voltage transistor to be used as an EHT output stage. Such a transistor may be used to provide a regulated EHT of up to 27 KV at 1 mA and a frequency of 95 kHz. At 27 KV, 0.6 mA and 69 kHz, the total power loss is only about 1.8W.

It will be appreciated by those of ordinary skill in the art that the present invention can be embodied in other specific forms without departing from the spirit or essential character thereof. The disclosed embodiments are therefore considered in all respects to be illustrative and not restrictive. The scope of the invention is indicated by the appended claims, and all changes which come within the meaning and range of equivalents thereof are intended to be embraced therein.

What is claimed is:

1. For use in a video monitor, an apparatus comprising:
   a first power transistor connected to power and ground voltages and having a first control electrode;
   a second power transistor connected to power and ground voltages and having a second control electrode;
   a signal comprising periodic retrace pulses for periodically switching off the first and second power transistors; and
   a drive circuit coupled to said signal and to said first and second control electrodes, said circuit comprising:
      means for providing a positive drive current to said first and second control electrodes;
      means for causing a first negative drive current to flow from said first control electrode, producing a negative voltage at said first control terminal; and
      means coupled to said first control electrode and said second control electrode of said second power transistor and responsive to said negative voltage for causing a second negative drive current to flow from said second control electrode.

2. The apparatus of claim 1 wherein said means for providing a positive drive current comprises:
   a transformer primary winding having one side coupled to said first control electrode; and
   a further coil having one side coupled through rectifying means to said one side of said transformer primary winding and having another side coupled to said second control electrode.

3. The apparatus of claim 1 wherein said means for providing a first negative drive current comprises a transformer secondary winding having one side coupled to said first control electrode and having another side coupled to ground.

4. The apparatus of claim 1 wherein said means for providing a second negative drive current comprises rectifying means coupled so as to conduct current from said second control electrode to said first control electrode.

5. A circuit for driving an inductive load, comprising: a DC voltage source;
   amplifying means having a first output terminal coupled to the inductive load, a second output terminal coupled to a common terminal, and an input terminal;
   a transformer having primary and secondary windings each having first and second terminals, wherein the first terminal of the primary is coupled to a switch to said DC voltage source for supplying current to the primary and the second terminal of the primary is coupled to said input terminal, and the first terminal of the secondary is coupled to the second terminal of the primary and the second terminal of the secondary is coupled through a unidirectional device to the common terminal; and
   a resistive element coupled in series with said primary winding; wherein the transformer windings are arranged so that the first terminals of the primary and secondary have the same polarity and wherein said switch has a maximum and a minimum frequency of operation, said DC voltage source being chosen such that said current does not exceed a predetermined maximum value at said minimum frequency of operation.

* * * * *